United States Patent
Chou et al.

(10) Patent No.: US 8,130,544 B2
(45) Date of Patent: Mar. 6, 2012

(54) METHOD OF REDUCING BIT ERROR RATE FOR A FLASH MEMORY

(75) Inventors: Ming-Hung Chou, Hsinchu (TW); Chien-Fu Huang, Hsinchu (TW); Han-Lung Huang, Hsinchu (TW); Shih-Keng Cho, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 451 days.

(21) Appl. No.: 12/542,609

(22) Filed: Aug. 17, 2009

(65) Prior Publication Data

US 2011/0038205 A1 Feb. 17, 2011

(51) Int. Cl.
*G11C 11/34* (2006.01)

(52) U.S. Cl. .......... 365/185.03; 365/185.02; 365/185.09

(58) Field of Classification Search ............. 365/185.03, 365/185.09, 185.02, 185.18, 185.17, 185.19
See application file for complete search history.

(56) References Cited

U.S. PATENT DOCUMENTS

| | | | |
|---|---|---|---|
| 7,301,839 B2 | 11/2007 | Li et al. | |
| 7,321,510 B2 | 1/2008 | Li et al. | |
| 7,372,730 B2 | 5/2008 | Chen | |
| 7,443,729 B2 | 10/2008 | Li et al. | |
| 7,447,076 B2 | 11/2008 | Mokhlesi | |
| 7,477,547 B2* | 1/2009 | Lin | 365/185.09 |
| 7,480,176 B2 | 1/2009 | Kamei | |
| 7,499,319 B2 | 3/2009 | Mokhlesi | |
| 7,961,512 B2* | 6/2011 | Li et al. | 365/185.03 |
| 2007/0279992 A1* | 12/2007 | Cernea et al. | 365/185.21 |

FOREIGN PATENT DOCUMENTS

| | | |
|---|---|---|
| WO | WO2007/132453 A2 | 11/2007 |
| WO | WO2007/132457 A2 | 11/2007 |
| WO | WO2008/026203 A2 | 3/2008 |

* cited by examiner

*Primary Examiner* — Richard Elms
*Assistant Examiner* — Hien Nguyen
(74) *Attorney, Agent, or Firm* — Squire Sanders (US) LLP

(57) ABSTRACT

A method of reducing coupling effect in a flash memory is disclosed. A neighboring page is read, and a flag is set active if the neighboring page is an interfering page. Data are read from the neighboring page at least two more times using at least two distinct read voltages respectively. The threshold-voltage distributions associated with an original page and the neighboring page are transferred according to the read data and the flag.

19 Claims, 5 Drawing Sheets

US 8,130,544 B2

METHOD OF REDUCING BIT ERROR RATE FOR A FLASH MEMORY

BACKGROUND OF THE INVENTION

1. Field of the Invention

The present invention generally relates to a flash memory, and more particularly to a method of reducing bit error rate for a flash memory.

2. Description of the Prior Art

Flash memory is a non-volatile solid state memory device that can be electrically erased and reprogrammed, and is a specific type of electrically erasable programmable read-only memory (EEPROM) device. Conventional flash memory stores a single bit of information in each memory cell such that each memory cell can be programmed to assume two possible states. The conventional flash memory is thus commonly referred to as single-level cell (SLC) flash memory or single-bit cell (SBC) flash memory. Modern flash memory is capable of storing two or more bits of information in each memory cell such that each memory cell can be programmed to assume more than two possible states. The modern flash memory is thus commonly referred to as multi-level cell (MLC) flash memory or multi-bit cell (MBC) flash memory.

In the MLC flash memory, data of different state are programmed to the flash memory by storing different amount of charge in the floating gate of the flash memory. As the charge in the floating gate specifically determines the corresponding threshold voltage, the data can then be read from the MLC flash memory according to their different threshold voltage. Due to variations among the memory cells during the manufacture, operation or according to other factors, the threshold voltage of each state is not a constant value but a range. When the flash memory is being read, the threshold voltage of a cell is compared to read voltages to determine its state.

The read voltages for reading data from the traditional MLC flash memory are constant. In practice, however, the threshold voltage distribution may probably shift after the flash memory has been subjected to a predetermined number of program/erase cycles or/and a predetermined data retention time has elapsed. Furthermore, due to coupling effect caused by neighboring page or pages, the distribution may widen sufficiently such that neighboring states may partially overlap. For example, as shown in FIG. 1 (in which only two states are concerned and shown for illustrative purpose), the initial distribution 10 with read voltage Th0 may be suffered from retention issue after a long time not going through program/erase cycle, and therefore drifted downward to a shifted distribution 12 with a new read voltage Th1. Furthermore, the neighboring states of the shifted distribution 12 partially overlap, resulting in error bits. If the extent of the overlapping is large, error correction control (ECC) may not be capable of correcting the error bits.

For the reason that conventional MLC or SLC flash memory could probably result in read errors due to coupling effect, a need has arisen to propose some novel schemes to reduce bit error rate for the flash memory.

SUMMARY OF THE INVENTION

In view of the foregoing, it is an object of the present embodiment to provide a method of bit error rate for a flash memory in order to cancel or at least reduce the coupling effect between neighboring pages of the flash memory.

According to one embodiment, a neighboring page is read, and a flag is set active if the neighboring page is an interfering page. Data are read from the neighboring page at least two more times using at least two distinct read voltages respectively. The threshold-voltage distributions associated with an original page and the neighboring page are transferred according to the read data and the flag. Specifically, in one embodiment, a rightmost part of the threshold-voltage distribution is transferred leftward, or a leftmost part of the threshold-voltage distribution is transferred rightward according to the read data using the initial read voltage, the read data using the backward read voltage, the read data using the forward read voltage, and the flag.

DETAILED DESCRIPTION OF THE INVENTION

Figure 1:
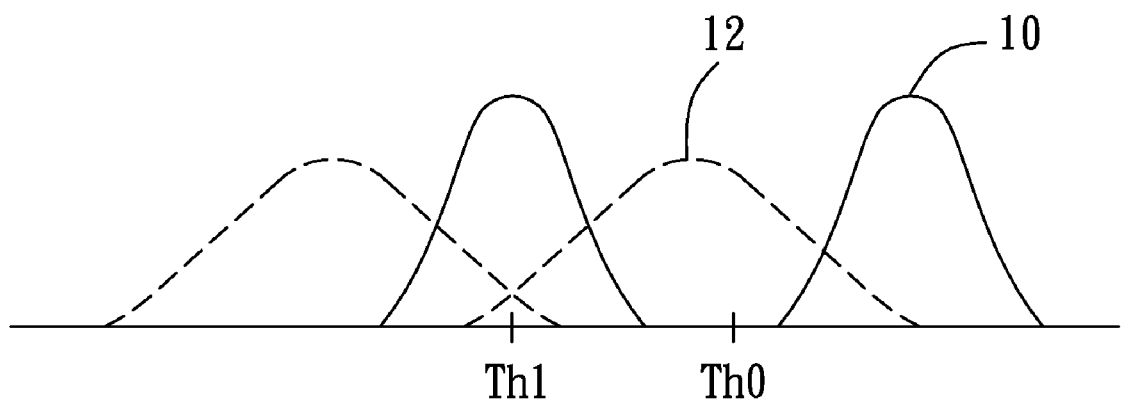
FIG. 1 shows widened distribution due to coupling effect.
Figure 2:
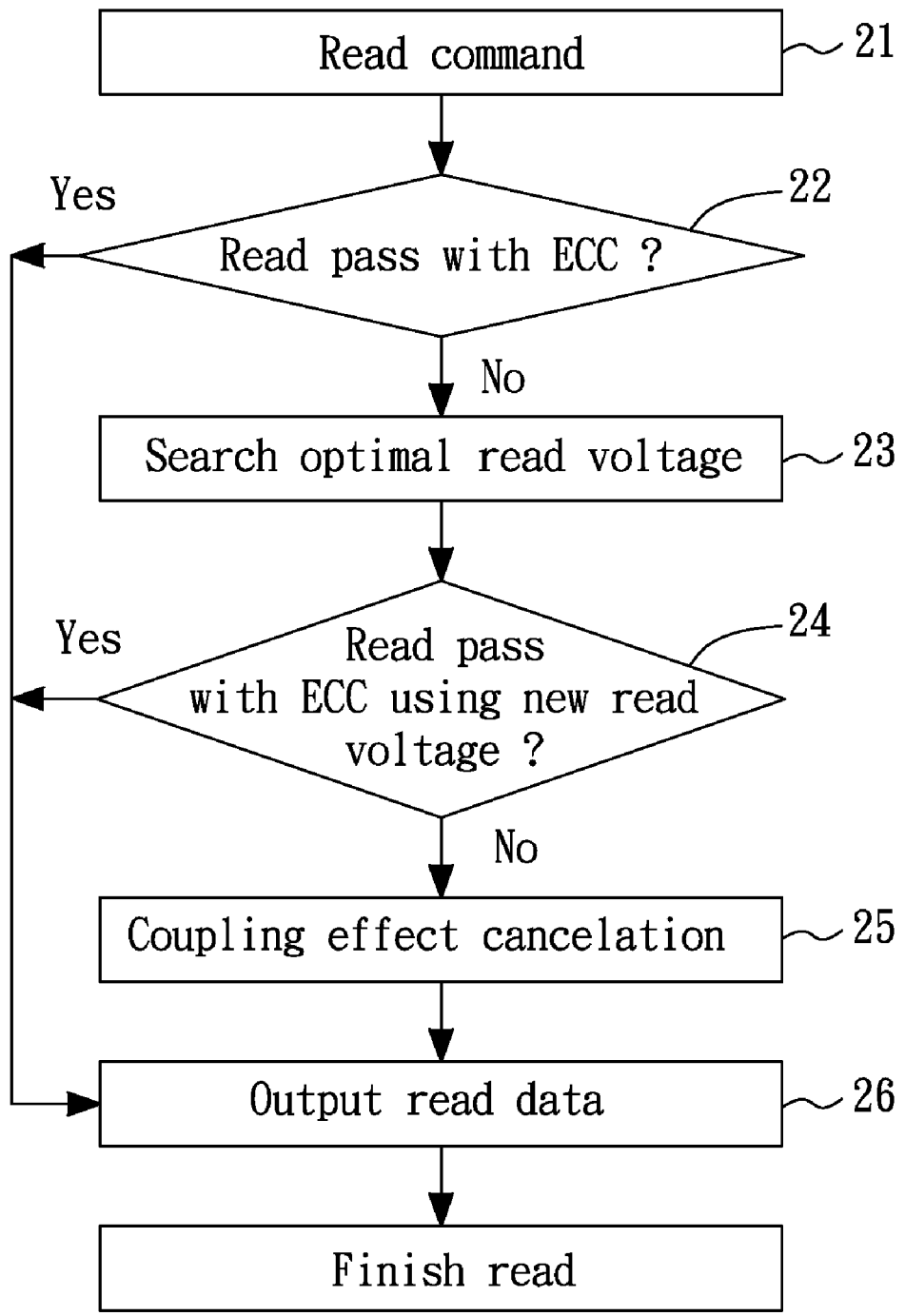
FIG. 2 is a flow diagram that illustrates a read flow of a flash memory according to one embodiment of the present invention.

FIG. 2 is a flow diagram that illustrates a read flow of a flash memory according to one embodiment of the present invention. The embodiment may be adapted to a multi-level cell (MLC) flash memory as well as a single-level cell (SLC) flash memory.

Referring to FIG. 2, after the flash memory is requested by a read command (the step 21), the read data are checked for the compliance with error correction control (ECC) in the step 22. If the reading passes the ECC check, the read data are outputted (the step 26); otherwise, an optimal read voltage is searched in the step 23, followed by re-reading the flash memory using the newly searched read voltage to replace a default read voltage. This newly searched read voltage may be used to resolve the problem caused by distribution shift. The step 23 may be implemented by, but not limited to, methods disclosed, by the same assignee, in another U.S. patent application entitled "METHOD AND SYSTEM OF FINDING A READ VOLTAGE FOR A FLASH MEMORY," the disclosure of which is hereby incorporated by reference.

As discussed in the background of the invention, the overlapped distribution due to coupling effect cannot be resolved even an optimal read voltage, such as that searched in the step 23, has been determined. Therefore, if the re-reading still cannot pass the ECC check in the step 24, a coupling effect canceling step 25 is thus needed in this embodiment to resolve the coupling effect, before the read data may be correctly outputted (the step 26).

Figure 3:
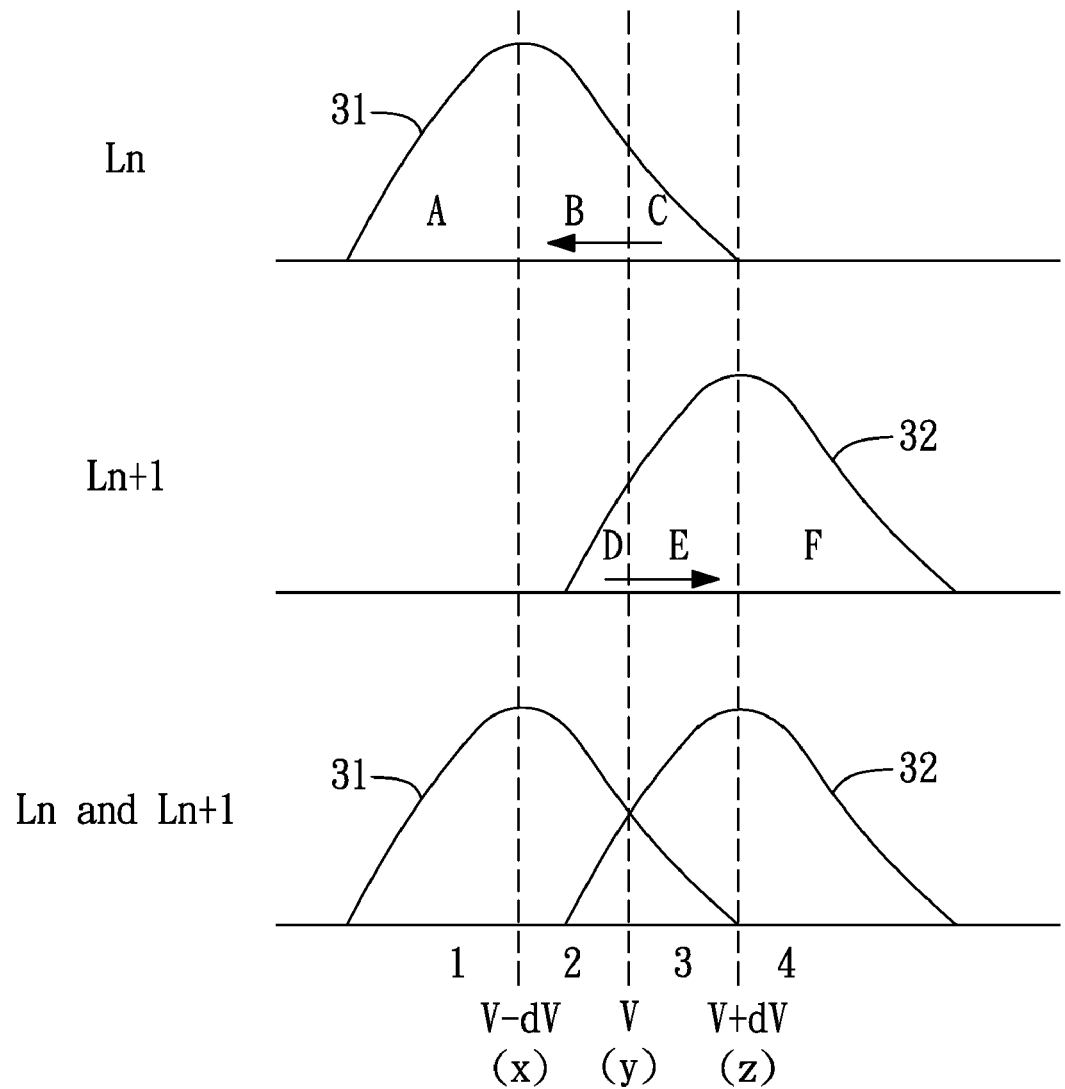
FIG. 3 schematically shows two overlapped or coupled distribution curves that belong to neighboring interfering pages respectively.

FIG. 3 schematically shows two overlapped or coupled distribution curves that belong to neighboring interfering pages respectively. In this specification, the interfering page according to the embodiment means a page that will induce coupling effect to the interfered page. For example, the interfering and interfered pages may be on the same word line but different bit lines, or may be on the same bit line but different word lines.

Referring to FIG. 3, the first distribution 31 on the n-th line Ln may be divided, from left to right, into three parts: part A, part B and part C; and the second distribution 32 on the (n+1)-th line Ln+1 may be also divided, from left to right, into three parts: part D, part E and part F. In the figure, part A belongs to a first (1) region; parts B and D belong to a second (2) region; parts C and E belong to a third (3) region; and part F belongs to a fourth (4) region. According to the embodiment of the present invention, as the rightmost part C of the first distribution 31 may be the portion that is erroneously effected by the coupling effect from an interfering page, for example, on the (n+1)-th line Ln+1, it is one target of the present embodiment to transfer the part C, for example, to the left side of a read voltage V, such as the searched optimal read voltage from the step 23 (FIG. 2), in order to cancel or reduce the coupling effect. Similarly, it is essential to transfer the leftmost part D of the second distribution 32 to the right side of the read voltage V in order to cancel or reduce the coupling effect.

Figure 4:
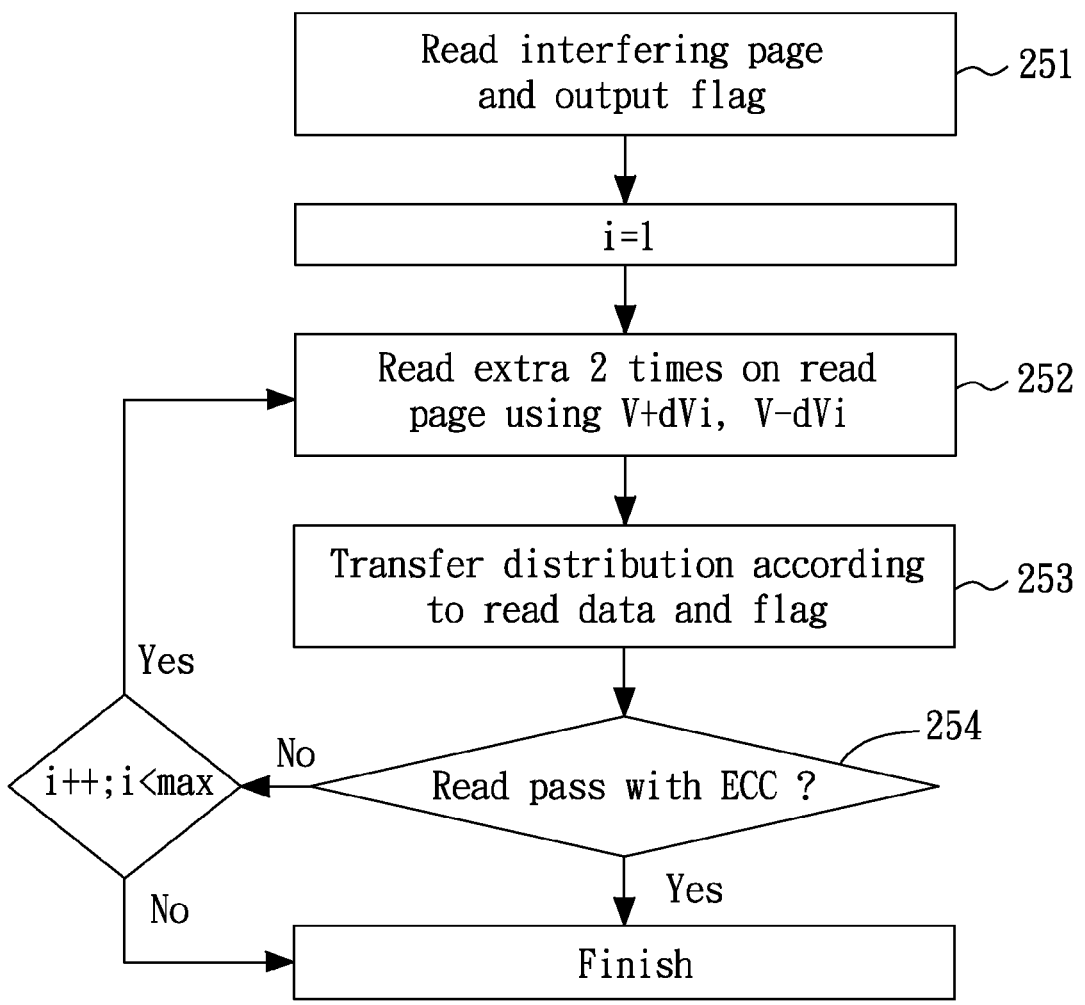
FIG. 4 shows a detailed flow diagram of the coupling effect canceling step in FIG. 2 according to one embodiment of the present invention.

FIG. 4 shows a detailed flow diagram of the coupling effect canceling step 25 in FIG. 2 according to one embodiment of the present invention. In the step 251, a neighboring page, such as the page on the (n+1)-th line Ln+1 is read. If the neighboring page is an interfering page, a flag (w) is set "1" or set active; otherwise, the flag is set "0" or set inactive. For example, for a 3-bit MLC flash memory, if the neighboring page has been group (or page) C programmed, the flag is set "1" and vice versa. With respect to the sequence of programming the flash memory, the method disclosed, for example, in U.S. Pat. No. 6,657,891 entitled "SEMICONDUCTOR MEMORY DEVICE FOR STORING MULTIVALUED DATA" may be adapted, and the disclosure of which is hereby incorporated by reference.

Subsequently, in the step 252, the neighboring page is read at least two more times using two distinct read voltages respectively. In the embodiment, as shown in FIG. 3, these two distinct read voltages include a backward read voltage that is smaller than the initial read voltage V, or equivalently V−dV; and a forward read voltage that is larger than the initial read voltage V, or equivalently V+dV. The value dV of the backward read voltage may be different from the value dV of the forward read voltage. The value dV may be predetermined and stored, for example, in a lookup table.

In the next step 253, the distributions are then subjected to transfer according to read data of the pages and the flag obtained in the step 251. In the embodiment, the distributions are transferred according to the rule illustrated in Table 1, where variable x represents the read data using the backward read voltage V−dV; variable y represents the read data using the initial read voltage; and variable z represents the read data using the forward read voltage V+dV.

TABLE 1

|  | Region 1 | Region 2 | Region 3 | Region 4 |
|---|---|---|---|---|
| Part | A | B, D | C, E | F |
| V − dV | 1 | 0 | 0 | 0 |
| V | 1 | 1 | 0 | 0 |
| V + dV | 1 | 1 | 1 | 0 |
| Result | always '1' | "0" if no coupled; otherwise, "y" | "1" if coupled; otherwise, "z" | always "0" |

According to the third column of Table 1, for example, the second (2) region is transferred to a final state "0" if the distributions are not coupled to each other; otherwise, the read data is set equal to the read data y using the initial read voltage V. According to the fourth column of Table 1, for example, the third (3) region is transferred to a final state "1" if the distributions are coupled to each other; otherwise, the read data is set equal to the read data z using the forward read voltage V+dV. Table 2 shows a complete truth table listing all combinations of the read data x/y/z and the flag w, and their associated final state F.

TABLE 2

| Region | x | Y | Z | W | F |
|---|---|---|---|---|---|
| 4 | 0 | 0 | 0 | 0 | 0 |
| 4 | 0 | 0 | 0 | 1 | 0 |
| 3 | 0 | 0 | 1 | 0 | 1 |
| 3 | 0 | 0 | 1 | 1 | 1 |
|  | 0 | 1 | 0 | 0 | 0 |
|  | 0 | 1 | 0 | 1 | 0 |
| 2 | 0 | 1 | 1 | 0 | 0 |
| 2 | 0 | 1 | 1 | 1 | 1 |
|  | 1 | 0 | 0 | 0 | 0 |
|  | 1 | 0 | 0 | 1 | 0 |
|  | 1 | 0 | 1 | 0 | 1 |
|  | 1 | 0 | 1 | 1 | 1 |
|  | 1 | 1 | 0 | 0 | 1 |
|  | 1 | 1 | 0 | 1 | 1 |
| 1 | 1 | 1 | 1 | 0 | 1 |
| 1 | 1 | 1 | 1 | 1 | 1 |

Figure 5A:
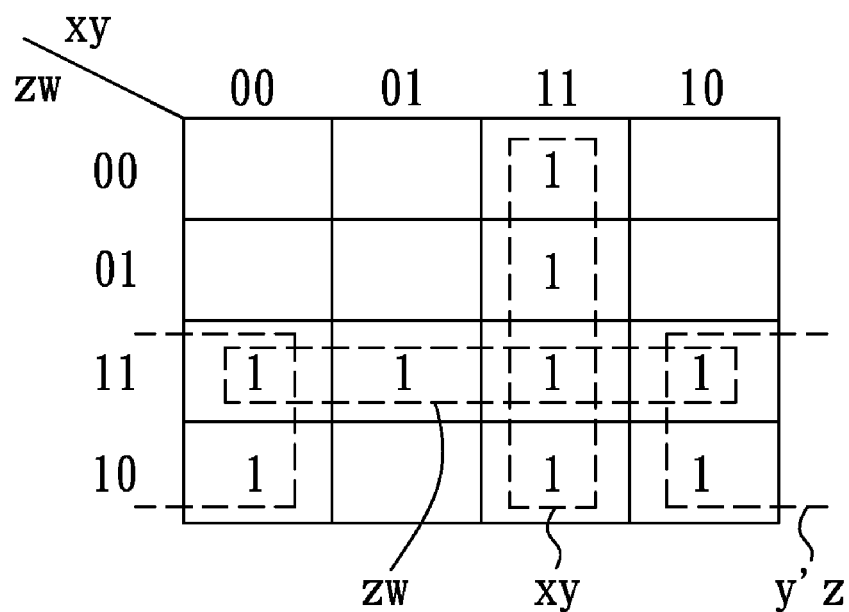
FIG. 5A shows a 4-variable Karnaugh map for simplifying the truth table in Table 2.
Figure 5B:
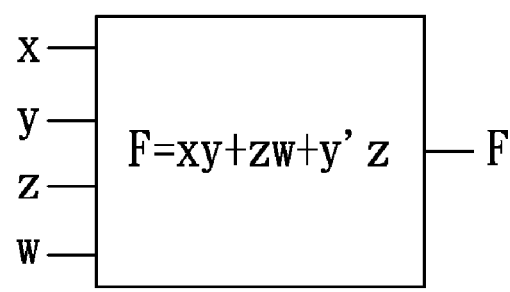
FIG. 5B shows a logic block corresponding to FIG. 5A.

The truth table shown in Table 2 may be simplified, for example, by a 4-variable Karnaugh map (or K-map for short) shown in FIG. 5A. The resultant relationship of the variables x/y/z/w and the final state F may be expressed as follows and depicted in FIG. 5B, a logic block that may be implemented by hardware circuit or software:

$$F = xy + zw + y'z$$

Referring back to FIG. 4, the transferred read data from the step 253 are then subjected to ECC check (the step 254). If the transferred read data do not pass the ECC check, the steps 252 and 253 may be performed again for one or more times, preferably using different value $dV_i$.

Although specific embodiments have been illustrated and described, it will be appreciated by those skilled in the art that various modifications may be made without departing from the scope of the present invention, which is intended to be limited solely by the appended claims.

What is claimed is:

1. A method of reducing coupling effect in a flash memory, comprising:
    reading a neighboring page that is neighboring an original page;
    outputting a flag that is set active if the neighboring page is an interfering page;
    reading data from the neighboring page at least two more times using at least two distinct read voltages respectively; and
    transferring threshold-voltage distributions associated with the original page and the neighboring page according to the read data and the flag.

2. The method of claim 1, wherein the flash memory is a multi-level cell (MLC) flash memory.

3. The method of claim 1, wherein the interfering page and the original page are on a same word line but on different bit lines respectively.

4. The method of claim 1, wherein the interfering page and the original page are on a same bit line but on different word lines respectively.

5. The method of claim 1, wherein the at least two distinct read voltages comprise:
    a backward read voltage that is smaller than an initial read voltage; and a forward read voltage that is larger than the initial read voltage.

6. The method of claim 5, in the transfer step, a rightmost part of the threshold-voltage distribution is transferred leftward, or a leftmost part of the threshold-voltage distribution is transferred rightward according to the read data using the initial read voltage, the read data using the backward read voltage, the read data using the forward read voltage, and the flag.

7. The method of claim 1, in the transfer step, a rightmost part of the threshold-voltage distribution is transferred leftward, or a leftmost part of the threshold-voltage distribution is transferred rightward when the flag is active.

8. The method of claim 1, wherein the step of reading data at least two more times and the transfer step are performed again for one or more times if the read data according the transferred distribution do not pass error correction control (ECC).

9. The method of claim 8, wherein different read voltages are used in each performance of the step of reading data at least two more times.

10. A method of reading a flash memory, comprising:
   reading data from the flash memory with a default read voltage;
   determining firstly whether the read data using the default read voltage passes error correction control (ECC);
   determining an optimal read voltage if the readout data using the default read voltage do not pass the ECC, and re-reading data from the array cells of the flash memory with the determined optimal read voltage;
   determining secondly whether the read data using the determined optimal read voltage passes the ECC; and
   reducing coupling effect in the flash memory in order to reduce bit error rate for the flash memory.

11. The method of claim 10, wherein the step of reducing the coupling effect comprises:
   reading a neighboring page that is neighboring an original page;
   outputting a flag that is set active if the neighboring page is an interfering page;
   reading data from the neighboring page at least two more times using at least two distinct read voltages respectively; and
   transferring threshold-voltage distributions associated with the original page and the neighboring page according to the read data and the flag.

12. The method of claim 10, wherein the flash memory is a multi-level cell (MLC) flash memory.

13. The method of claim 11, wherein the interfering page and the original page are on a same word line but on different bit lines respectively.

14. The method of claim 11, wherein the interfering page and the original page are on a same bit line but on different word lines respectively.

15. The method of claim 11, wherein the at least two distinct read voltages comprise:
   a backward read voltage that is smaller than an initial read voltage; and
   a forward read voltage that is larger than the initial read voltage.

16. The method of claim 15, in the transfer step, a rightmost part of the threshold-voltage distribution is transferred leftward, or a leftmost part of the threshold-voltage distribution is transferred rightward according to the read data using the initial read voltage, the read data using the backward read voltage, the read data using the forward read voltage, and the flag.

17. The method of claim 11, in the transfer step, a rightmost part of the threshold-voltage distribution is transferred leftward, or a leftmost part of the threshold-voltage distribution is transferred rightward when the flag is active.

18. The method of claim 11, wherein the step of reading data at least two more times and the transfer step are performed again for one or more times if the read data according the transferred distribution do not thirdly pass the ECC.

19. The method of claim 18, wherein different read voltages are used in each performance of the step of reading data at least two more times.

* * * * *